United States Patent [19]

Fritsch

[11] Patent Number: 5,105,532
[45] Date of Patent: Apr. 21, 1992

[54] MOUNTING DEVICE

[76] Inventor: Adalbert Fritsch, Haus Nr. 46, D-8455 Kastl, Fed. Rep. of Germany

[21] Appl. No.: 604,869

[22] Filed: Oct. 29, 1990

[30] Foreign Application Priority Data

Oct. 27, 1989 [DE] Fed. Rep. of Germany ....... 3935930

[51] Int. Cl.$^5$ ............................................. B23P 19/00
[52] U.S. Cl. ..................................... 29/740; 29/712; 29/720; 29/743; 29/759
[58] Field of Search ................. 29/740, 741, 743, 759, 29/720, 709, 712

[56] References Cited

U.S. PATENT DOCUMENTS

| | | | |
|---|---|---|---|
| 3,611,561 | 10/1971 | Dosier | 29/759 |
| 4,875,285 | 10/1989 | Haan et al. | 29/759 |
| 4,888,864 | 12/1989 | Masaki | 29/759 |
| 4,905,370 | 3/1990 | Hineno et al. | |
| 4,985,986 | 1/1991 | Fritsch | 29/743 |

FOREIGN PATENT DOCUMENTS 0062335 10/1982 European Pat. Off. .
0118689 9/1984 European Pat. Off. .

OTHER PUBLICATIONS

Friedrich, D., et al., "DMT–die neue Bestuckungstechnik fur Flachbaugruppen", *Siemens Components*, 24(6):211 (1986).

*Primary Examiner*—P. W. Echols
*Attorney, Agent, or Firm*—Scully, Scott, Murphy & Presser

[57] ABSTRACT

The invention relates to a mounting device for mounting components on printed circuit boards, comprising a supply carrier for the components, a first unit in the form of a printed circuit board carrier for holding at least one printed circuit board, and a second unit arranged in a plane above the supply carrier and above the printed circuit board carrier in the form of a tool movable in the z-direction to transfer the components from the supply means to the printed circuit board held in the printed circuit board carrier, wherein one of the two units can be moved in an x-y-plane relative to the respective other unit. According to the invention the respective other unit can also be moved in an x-y-plane and the tool can be arrested in a predetermined parking position by means of a tool-arresting device to deposit the component taken from the supply carrier on the printed circuit board.

29 Claims, 4 Drawing Sheets

MOUNTING DEVICE

TECHNICAL FIELD OF THE INVENTION

The invention relates to a device for mounting components, such as SMD components, on printed circuit boards.

BACKGROUND OF THE INVENTION AND PRIOR ART

A mounting device of this kind is known in practice in which the tool, in the form of a suction needle, is stationary while the printed circuit board carrier is a coordinate carriage which can be moved in the x- and y-directions. The printed circuit board carrier is combined with the supply means and thus also accommodates the components provided for mounting as well as the printed circuit boards on which they are to be mounted. Above the tool there is also a stationary microscope by means of which a specific region about the free end of the tool provided to receive the component can be viewed.

To mount the printed circuit boards a printed circuit board carrier is moved into a delivery position in which the component to be mounted lies exactly beneath the tool and on its axis. The tool is then lowered to take the component from the printed circuit board carrier and then lifted again. A further movement of the printed circuit board carrier into a mounting position brings the point of the printed circuit board at which the component is to be mounted exactly beneath and on the axis of the tool. The tool is then lowered to place the component on the printed circuit board on to which it is to be attached. After again raising the tool the mounting cycle can begin again.

A further mounting device is known in practice in which the printed circuit board carrier is stationary and the tool can be moved. The mounting procedure is carried out with this device using the same sequence of steps as in the device described above, but is reversed kinematically in that the tool instead of the printed circuit board carrier is moved between the pick-up positions for picking up a component from the supply means and the mounting positions to place the component on the printed circuit board.

The known mounting devices described above are constructionally designed so that only one of the two units moves from a first mounting position into a delivery or pick-up position and thereafter back into a subsequent mounting position that is different from the first mounting position. This sequence of movements between constantly changing mounting positions and pick-up and delivery positions must be adhered to and requires an indexing device which, if it is used to determine exactly the respective position to be moved to, has a relatively complicated and expensive construction. Furthermore, to cover the paths between the individual positions takes the movable unit a corresponding period of time.

SUMMARY OF THE INVENTION

The mounting device of the present invention includes a tool and a printed circuit board carrier which are independently movable. The individual movements are not made by one unit but by both the tool and the printed circuit board carrier. Starting from a parking position the tool moves to a pick-up position and back to the unchanging parking position, while simultaneously the printed circuit board carrier moves to the next mounting position from the previous one. By carrying out the movements simultaneously along shorter paths time is saved. The first movement of the tool from the respective pick-up position into the parking position does not require indexing. The printed circuit board carrier covers very short distances between the individual mounting positions and can therefore be controlled with high precision. The system according to the invention is very flexible and can be expanded as it can be designed for both manual and semi-automatic operation.

Advantageously the location of the printed circuit board carrier in the mounting positions to which it can be moved by drive means and in which it can be arrested is effected by a programmable indexing device.

Advantageously at least one pick-up position is provided into which the tool can be moved and in which it can be moved in the z-direction to pick up the component from the supply means. The tool can be arrested in the pick-up position. The tool can advantageously be moved into the pick-up position by means of a drive and, according to a further development of the invention, on reaching the pick-up position can be moved automatically in the z-direction.

Preferably the supply means can be moved to and arrested in delivery positions in which the components to be delivered are aligned with the tool located in the pick-up position. The delivery positions of the supply means can be determined by a programmable indexing device. According to a further development of the invention the supply means can be moved into the respective delivery position, in which it can also be arrested, by means of a drive.

The supply means is preferably arranged in a plane above the printed circuit board carrier. It can project into the field of movement of the printed circuit board carrier so that the path between the parking position and the pick-up position is short and can be covered correspondingly quickly by the tool. The supply means preferably includes a conveyor belt or a magazine with an exchangeable turntable. It is advantageous to provide the supply means with containers to accommodate respective identical components.

A cover, arranged in a plane between the raised and lowered tool positions, is advantageously provided for the supply means and for the printed circuit board carrier having respective access openings for the tool to gain access to the supply means and to the printed circuit board carrier. The cover is preferably removable. The cover can comprise several parts wherein both access openings, formed as cut-outs from the edge, are arranged in one cover part or in several cover parts. The cover preferably includes at least one stationary part and at least one slidable part.

According to a further development of the invention a microscope is provided of which the visual field includes the mounting point on the printed circuit board.

The tool-arresting device may include a stationary stop on a frame part of the mounting device and a counter stop on a supporting arm that can be moved on the frame part and which carries the tool.

According to a more advantageous embodiment the tool-arresting device includes a pin that can be moved back and forth on the frame part and a bore made in the supporting arm to accommodate the pin with substantially no play. To simplify aligning the pin with the bore it is advantageous if the bore has an inner bore section accommodating the pin with substantially no play and an outer bore section, conically tapered down to this inner section, of which the largest cross-section forms a capture region for catching the pin and moving the tool-supporting arm until the pin is received in the inner bore section. The pin can be coupled to the free end of the crank arm of a thrust crank which can be driven by an electric motor. A useful embodiment is one in which a sensor circuit for detecting the dead center positions of the pin and for switching off the electric motor on reaching these dead center positions is provided.

According to a further alternative embodiment the tool-arresting device has an electromagnet fastened to the frame part and two counter-poles fixed to the supporting arm, with an air-gap provided between the poles of the electromagnets and the counter-poles which, together with the strength of the electromagnets, forms a capture region for the counter-poles.

The mounting device may have a further second sensor circuit which includes a sensor fixed to the frame part and a signal generator fixed to the tool-supporting arm and serves to switch on the electric motor for the purpose of lowering the pin or to activate the electromagnets when the sensor arrives in the region of the signal generator, this region being of substantially the same size as the capture region of the outer bore section or of the electromagnet.

The mounting device preferably includes a further third sensor circuit to detect the upward movement of the tool in the parking position and to switch on the electric motor for the purpose of raising the pin on detecting the upward movement.

BRIEF DESCRIPTION OF THE DRAWINGS

The invention will now be described in more detail with reference to a preferred exemplary embodiment shown in the drawings, in which.

DETAILED DESCRIPTION OF PREFERRED EMBODIMENTS OF THE INVENTION

Figure 1:
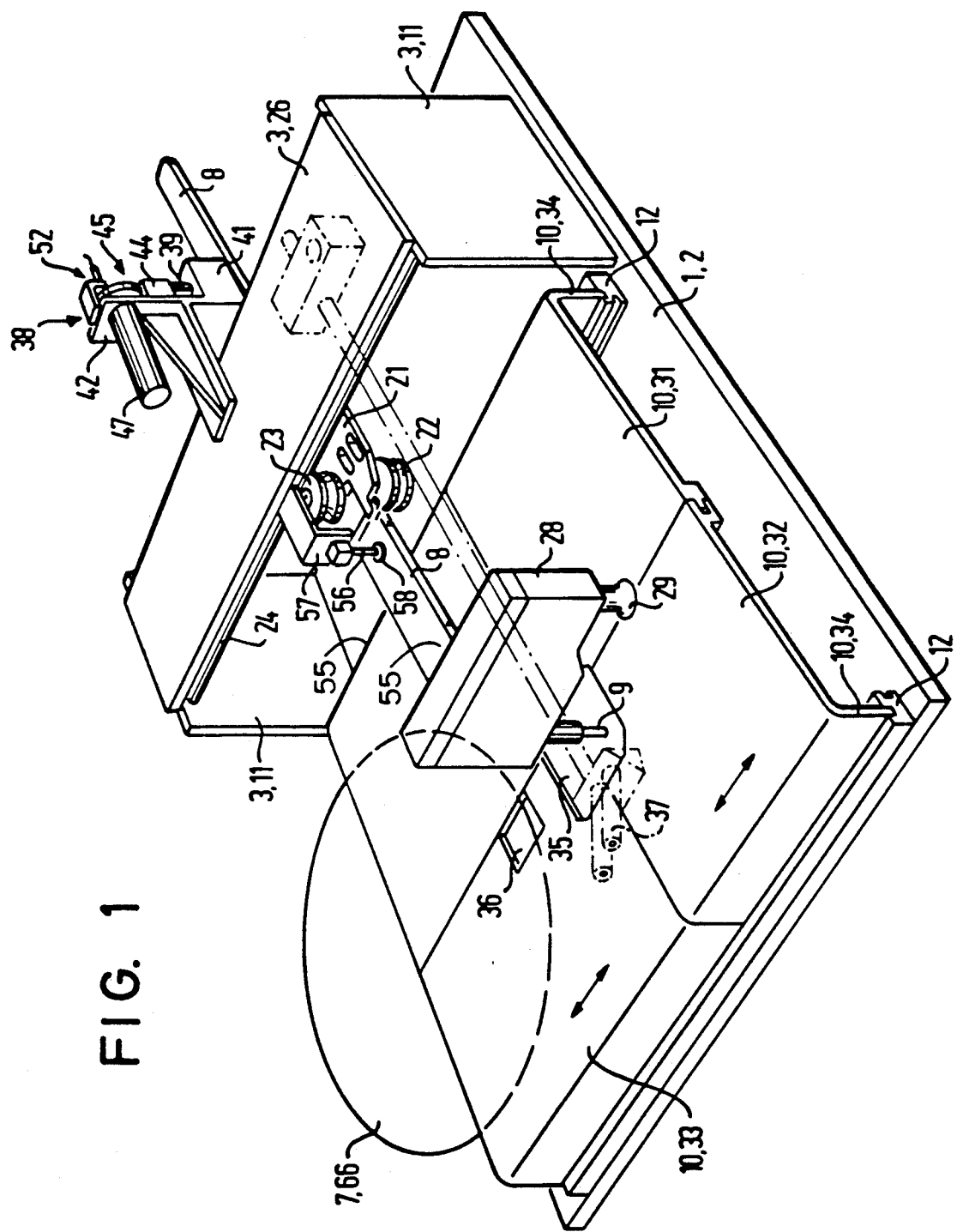
FIG. 1 is a perspective representation of the preferred exemplary embodiment of the mounting device according to the invention.

The mounting device according to the invention shown in the drawings includes a frame 1 with a bottom plate 2 and a frame part 3, a printed circuit carrier 4 for a printed circuit board 6 to be mounted with components 5, such as SMD components, a supply means 7 for the components 5, a tool-supporting arm 8 having a tool 9 to transfer the components 5 from the supply means 7 to the printed circuit board 6 to be mounted and a cover 10 for the printed circuit board carrier 4 and the supply means 7.

The frame part 3 has the shape of a U-shaped beam which is fixed with its limbs 11 in the rear region of the bottom plate 2 to the bottom plate. In the front region of the bottom plate 2 a printed circuit board carrier 4 is located that can move in x- and y-coordinate directions. For this purpose two guide rails 12 are fixed to the bottom plate 2 to guide a frame 13 in the x-coordinate direction. Guides 15 for the printed circuit board carrier 4 running in the y-coordinate direction are provided on the surfaces of the frame sections 14 of the frame 13 that are normal to the guide rails 12 and which face the inside of the frame. The printed circuit board carrier 4 includes a support plate 16 with a groove 17 extending in the x-coordinate direction having an undercut cross-section and two rails 18 each having a recess extending longitudinally of the rails to receive a printed circuit board 6. One of the rails 18 is arranged so that it can be displaced along the groove 17 to adapt the printed circuit board carrier 4 to hold printed circuit boards 6 of different sizes. For this purpose this rail has a tongue 19 which can be braced against the support plate 16 by means of a screw 20 that can be moved along with its screw head in the groove 17.

The tool-supporting arm 8 is mounted so that it can move in x- and y-coordinate directions on the frame part 3. For this purpose a guide carriage 21 having four y-guide rollers 22 is provided to guide the tool-supporting arm 8 in the y-coordinate direction. The guide carriage 21 itself is guided in the x-coordinate direction by means of three x-guide rollers 23 on respective guide rails 24, 25 on the front and back of the transverse web 26 of the frame part 3. The guide rail 24 on the front of the web 26 has a circular cross-section and engages in one of the x-guide rollers 23. The guide rail 25 on the back of the web 26 has a rectangular cross-section with a lower and an upper guide face for the two remaining x-guide rollers 23. The guide carriage 21 and the guide rail 24 are shielded from the front region of the mounting device by a panel 27 fixed to the frame part 3. The web 26 and the tool arresting device 38 are covered by cover 67.

The tool 9 is a suction needle that can be connected to a vacuum source. It is of the kind usually used for mounting components on printed circuit boards, and for this reason does not need to be described in more detail. It projects from the underside of a tool block 28 which is fixed to the free front end of the tool-supporting arm 8 so that it can be moved vertically. Lowering of the tool block 28 with the suction needle 9 is done manually, and it is raised by the action of a spring assembly (not shown) which is supported inside the tool block 28 on the tool-supporting arm 8. A handle 29 is mounted on the tool block 28 with which the tool 9 can be moved manually between pick-up positions in which it picks up components 5 from the supply means 7 and a parking position shown in FIGS. 1 and 2. In the parking position the tool-supporting arm 8 and thus the tool 9 can be arrested by means of a tool-arresting device. The parking position is the position in which the tool 9 is lowered in order to place the component 5 picked up from the supply means 7 on the point of the printed circuit board 6 at which it is to be mounted.

The supply means 7 comprises a magazine with an exchangeable turntable 66 which is arranged in a plane above and parallel to the plane of movement of the printed circuit board carrier 4 and below and parallel to the plane of movement of the tool 9, projecting into the field of movement of the printed circuit board carrier 4, near the parking position of the tool 9. Containers 30 to accommodate different components 5 are mounted exchangeably in the outer peripheral region of the supply means 7.

The printed circuit board carrier 4 and the supply means 7 can be moved into and subsequently arrested in the respective required mounting positions or delivery positions by means of respective drive means (not shown) and an indexing device (also not shown). In a given mounting position the point of the printed circuit board 6 to be mounted is aligned with the tool 9 in the parking position. In a given pick-up position the turntable 66 is in the angular position in which the container 30 containing the required components 5 is located beneath the access opening 36. The required components 5 are those of which one or more is or are to be provided to be picked up by the tool 9 for mounting on the printed circuit board 6.

The cover 10 is arranged in a plane between the raised and the lowered positions of the tool 9. It comprises three cover parts 31, 32, 33, which as a whole form a U-shaped rail whose limbs 34 are arranged in grooves on the upper side of the guide rails 12. By means of a groove-and-spring arrangement in their adjacent edges that run in the x-coordinate direction, the parts 31, 32 and 33 support each other so as to maintain the whole cover in position. The rear cover part 31 is fixed while the two front cover parts 32, 33 can be moved in the x-coordinate direction with the groove-and-spring arrangement (not shown) in their front faces and the rim in the front guide rail 12 serving for guidance. Recesses cut out in the corner regions of the front cover parts 32, 33 facing one another and the rear cover part form an opening 35 enabling the tool 9 to gain access to the printed circuit board 6. A further access opening 36 for the tool 9 to reach the supply means 7 is formed as a cut-out from the edge of the front cover part 33 facing the rear cover part 31.

A microscope 37, pivotable by an arm, is mounted to the transverse web 26 of the frame 3. The field of vision of the microscope 37 includes the point of the printed circuit board 6 currently being mounted.

Figure 3:
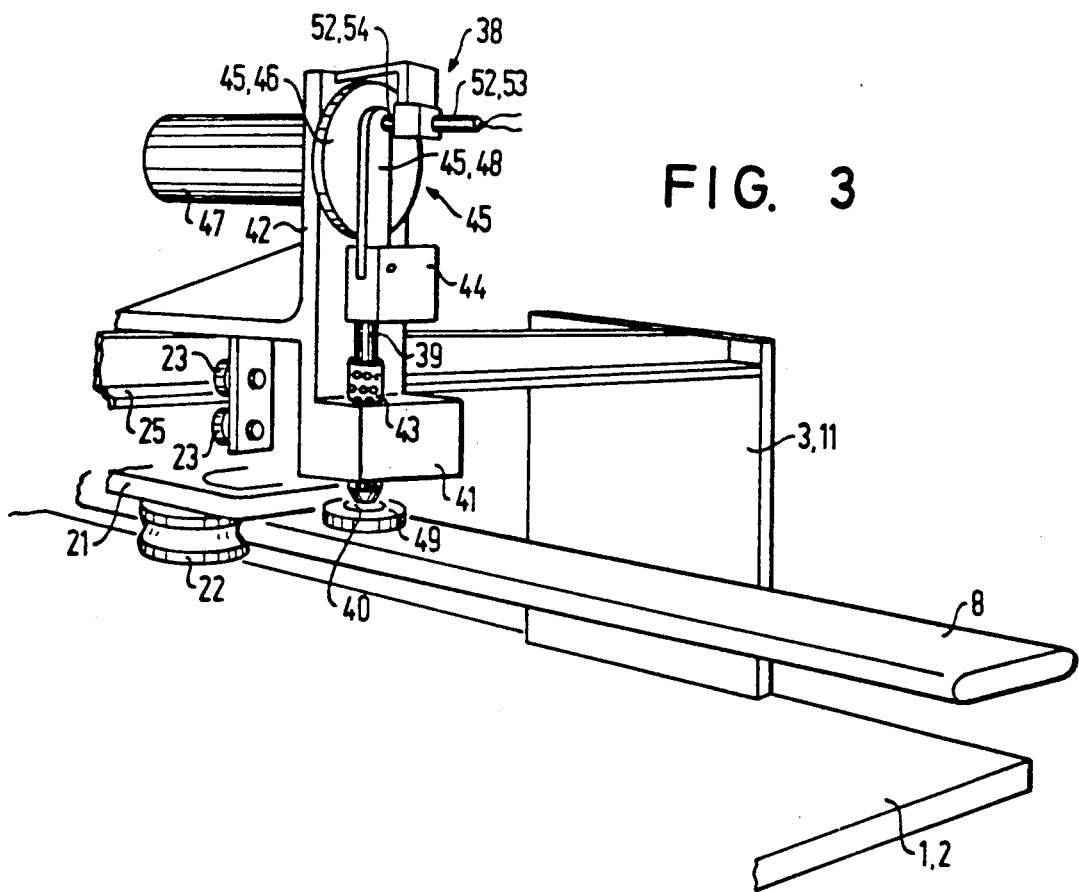
FIG. 3 is an enlarged perspective representation of a tool-arresting device shown in FIG. 1.
Figure 3A:
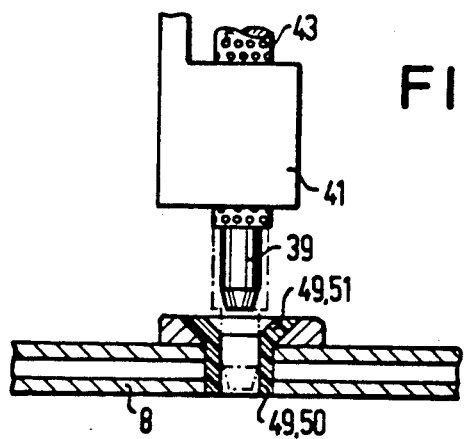
FIG. 3a is an enlarged sectional representation of the arresting element of the tool-arresting device shown in FIG. 3.

The tool-arresting device 38 shown in FIG. 3 includes a pin 39 that can be moved up and down on the frame part 3 and a through-bore made in the rear region of the tool-supporting arm 8 to accommodate the pin 39 with substantially no play. The pin is guided in a bore in a guide block 41 of an angle bracket 42 mounted on the web 26 of the frame part 3 by means of a ball bearing arrangement formed in a sleeve 43 surrounding the pin 39. To raise and lower the pin 39 a thrust crank 45 is provided, the crank disc of which can be driven by an electric motor 47 fixed to the angle support 42. The upper end of the pin 39 is linked within a connecting piece 44 to the free end of the crank arm 48 of the thrust crank 45.

The through-bore 40 is formed in an insert 49 passing through the tool-supporting arm 8. It includes an inner bore section 50 to accommodate the pin 39 with substantially no play and an outer bore section 51 which is tapered towards the inner bore section 50 and whose largest cross-section forms a capture region for catching the pin 39 and for moving the tool-supporting arm 8 until the pin 39 is received in the inner bore section 50. The lower end of the pin 39 is chamfered conically.

The mounting device according to the invention includes a sensor circuit 52 with two inductive proximity switches to detect the lower and upper dead centre positions of the pin 39 and to switch off the electric motor 47 every time the pin 39 reaches one of these dead center positions. The inductive proximity switch for detecting the upper dead center position of the pin 39 is shown in FIG. 3 and includes a sensor 53 and a signal generator 54 in the form of a small soft-iron plate. The latter is fixed where the crank arm 48 is joined to the crank disc 46 and the sensor is fixed to the angle support 42. The inductive proximity switch (not shown) for detecting the lower dead center position of the pin 39 likewise includes a sensor and a signal generator in the form of a small soft-iron plate, both of which are covered by the crank disc 46. The signal generator of this inductive proximity switch is fixed to the invisible rear side of the crank disc 46 and offset by 180° relative to the first mentioned signal generator 54. The associated sensor is correspondingly fixed to the angle bracket 42.

The mounting device according to the invention includes a further second sensor circuit 55 with an inductive proximity switch, which likewise includes a sensor and a signal generator. The sensor, indicated here by the reference numeral 56, is fixed by an angle section 57 to the front side of the transverse web 26 in front of the panel 27 (see FIG. 2). The signal generator in the form of a small circular soft-iron plate, indicated here by the reference numeral 58, is fixed to the front of the tool-supporting arm 8. Its diameter is larger than that of the sensor 56 and substantially corresponds to the largest diameter of the outer bore section 51 of the through-bore 40. The x and y distance between the sensor 56 and the signal generator 58 is always the same as the x and y distance between the pin 39 and the through-bore 40 of the tool-arresting device 38.

Furthermore a third sensor circuit (not shown here) is provided for detecting the upward movement of the tool 9 in the parking position and/or the pick-up position and for switching on the electric motor 47 for the purpose of raising the pin 39 and/or for switching on the drive of the supply means 7 on detecting the upward movement.

Figure 2:
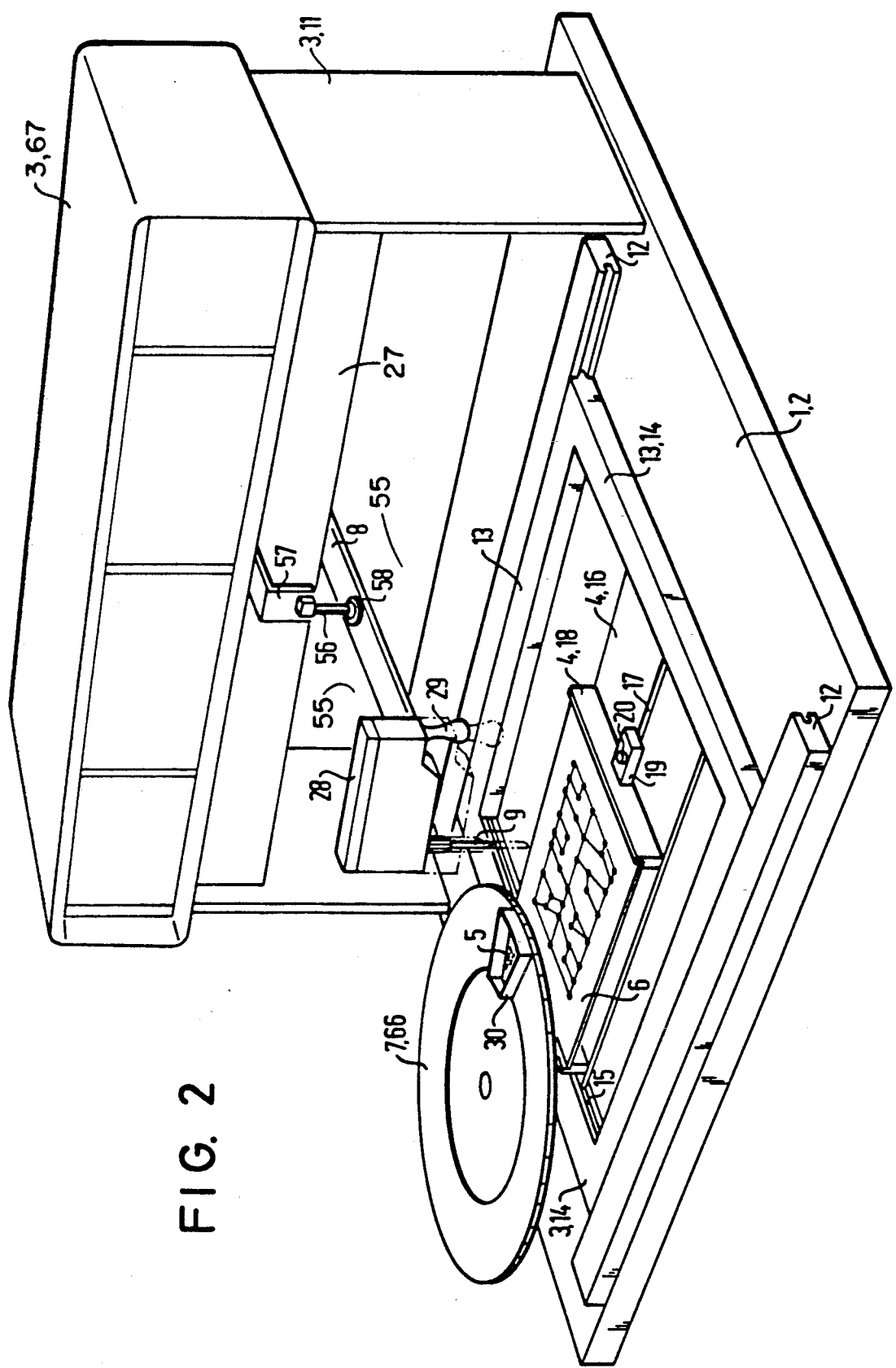
FIG. 2 is an enlarged perspective representation of the mounting device shown in FIG. 1 without a cover and without the details of x- and y-guidance of a tool-supporting arm.
Figure 4:
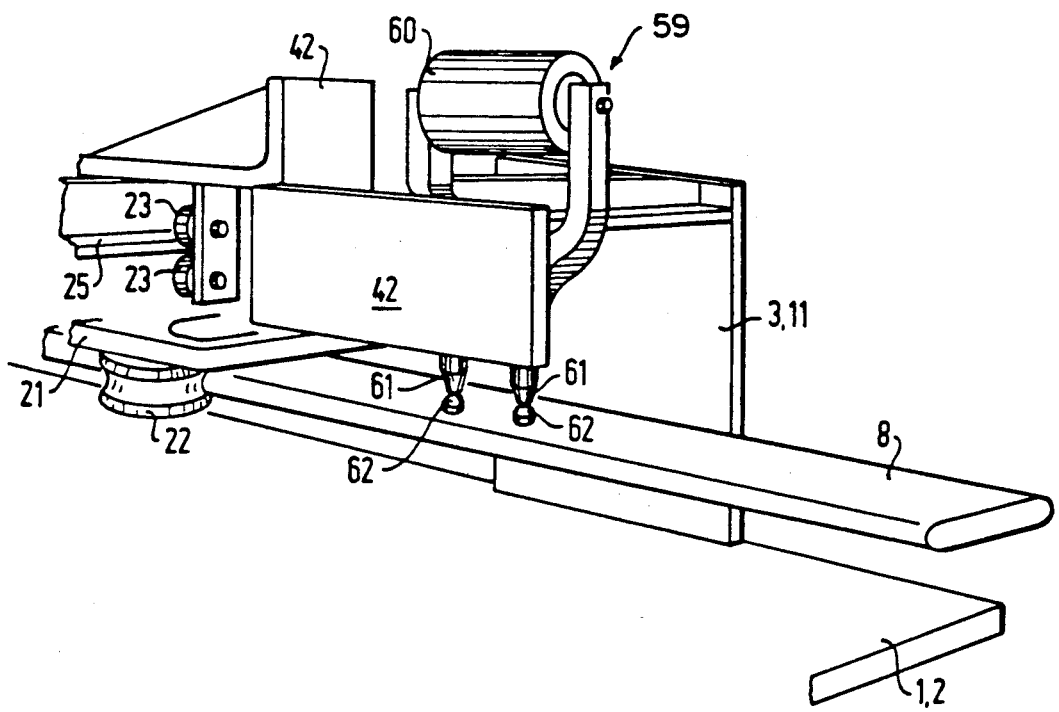
FIG. 4 is an enlarged perspective representation of a tool-arresting device according to a second embodiment.

An alternative embodiment of the tool-arresting device is shown in FIG. 4 and indicated there by the reference numeral 59. It includes an electromagnet 60 with two poles 61 fixed to the angle support 42 and two counter-poles 62 fixed to the rear region of the tool-supporting arm 8. The counter-poles 62 are oppositely polarized to their respective associated poles 61. As shown in FIG. 4 there is an air-gap between the poles 61 and the counter-poles 62 when these are opposite one another which, together with the strength of the electromagnet 60, forms a capture region for the counter-poles 62. The second sensor circuit 55, shown in FIGS. 1 and 2, is used to activate the electromagnet 60. The x and y distance between the sensor 56 and signal generator 58 is always the same as the x and y distance between the poles 61 and the counter-poles 62.

Figure 5:
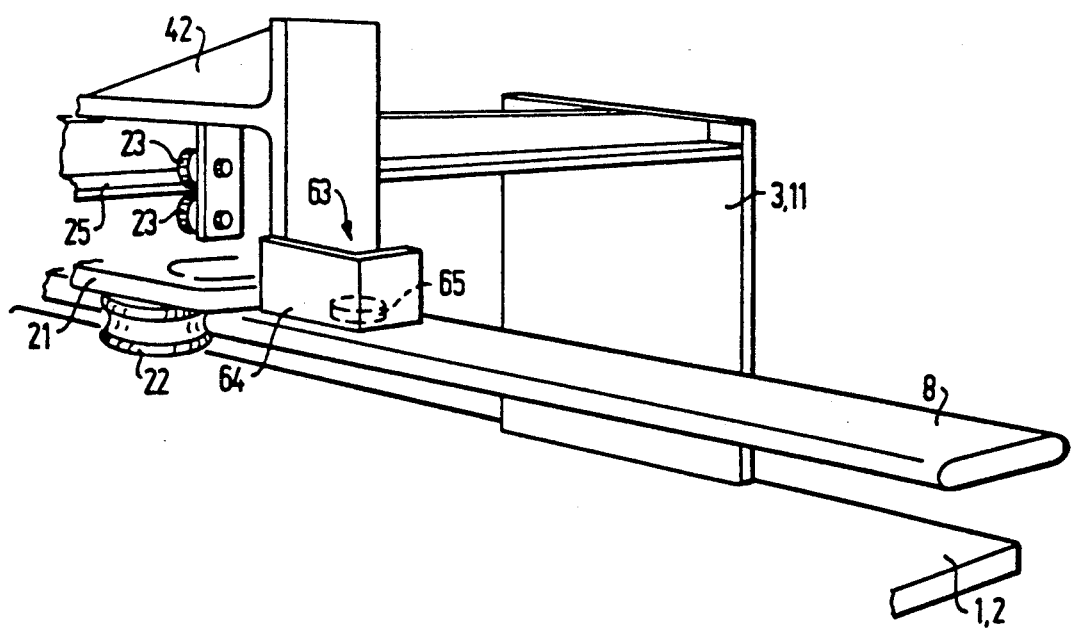
FIG. 5 is an enlarged perspective representation of a tool-arresting device according to a third embodiment.

A further alternative embodiment of the tool-arresting device is shown in FIG. 5 and indicated by the reference numeral 63. This arresting device includes a right-angled stop 64 fixed to the angle support 42 and a counter-stop 65 mounted in the rear region of the tool-supporting arm 8. The counter-stop 65 is arranged to enter the space encompassed by the limbs of the right-angled stop 64 until it meets these limbs.

The operation of the mounting device according to the invention will now be described with reference to the tool-arresting device 38 shown in FIG. 3:

First of all a printed circuit board 6 to be mounted is braced between the rails 18 of the printed circuit board carrier 4 using the screw 20. The turntable 66, with its separate containers 30 filled with the components 5 of different types required for mounting on the printed circuit board 6, is inserted in the supply means 7. Its indexing device is programmed so that while a component 5 is being picked up by the tool 9 the turntable 66 is in the delivery position in which the container 30 containing the components 5 required for the particular mounting process is located beneath the access opening 36. The cover parts 31, 32, 33 are then brought into the position shown in FIG. 1 to cover the the printed circuit board 6 and the loaded turntable 66 while allowing access through openings 35 and 36.

To mount components on the printed circuit board 6 the tool 9 is moved manually by means of the handle 29 from the parking position shown in FIG. 1 to the pick-up position which it is located in the region of the access opening 36. The turntable 66 is rotated into the required delivery position by the drive. By exerting pressure on the tool block 28 manually the tool 9 is lowered through the access opening 36 until it meets one of the required components 5 in the container 30 of the turntable 66 beneath the access opening 36 and picks it up by suction. By appropriately reducing the pressure manually exerted on it, the tool block 28, together with the tool 9 and the component 5, is moved back into the raised position under the influence of the elastic return forces of the spring inside the tool block 28. By means of the third sensor circuit this movement of the tool 9 is detected, and if necessary the drive of the supply means 7 is switched on to move the turntable 66 into the next delivery position.

By means of the handle 29 the tool 9 is now moved manually into the parking position, in which the signal generator 58 on the tool-supporting arm 8 and the outer section 51 of the bore 40 in the tool-supporting arm 8 are respectively located beneath the sensor 56 fixed to the frame part 3 and beneath the pin 39 of the tool-arresting device 38 in the upper dead center position. The sensor circuit 55 now reacts to the signal generated by the signal generator 58 in the sensor 56 by switching on the electric motor so that the pin 39 is lowered. A coaxial arrangement of these four components 39, 51 and 56, 58 is not necessary because the cross-sectional areas of the signal generator 58 and of the outer bore section 51 are larger than those of the sensor 56 and of the pin 39. If they are not arranged coaxially the pin 39 that is being lowered makes contact with the conical wall surface of the outer bore section 51 and displaces the tool-supporting arm 8 so that it is arranged coaxially with the inner bore section 50 and can then enter it to arrest the tool-supporting arm 8 in the parking position on reaching its dead centre position. In the lower dead centre position of the pin 39 the signal generator of the lower dead center inductive proximity switch is opposite the sensor of the lower dead center inductive proximity switch and in this position it generates a signal. In reaction to this signal the sensor circuit 52 switches off the electric motor 47 so that the pin 39 remains in the lower dead centre position.

The tool 9 is in the parking position above the access opening 35 and above the printed circuit board 6 that has already been moved into the mounting position beneath the access opening 35 by means of the drive of the printed circuit carrier 4. By exerting pressure manually on the tool block 28 the tool 9 with the component 5 is now lowered through the access opening 35 until the component 5 meets the point where it is to be mounted and is deposited on this point for fixing by automatically cutting off the vacuum. The tool block 28, together with the tool 9, is now moved back into the raised position by the resilience of the spring inside the tool block 28 by appropriate reduction of the manual pressure exerted on it. The third sensor circuit (not shown) detects this movement of the tool 9, and reacts to this by switching on the electric motor 47 to move the pin 39 up to its upper dead center position and in this way to unlock the tool-arresting device 38. On reaching the upper dead center position the sensor circuit switches off the electric motor 47 so that the pin 39 remains in this upper dead centre position. The third sensor circuit is also used, on detecting the upward movement of the tool 9 in the parking position when it is in the raised position, to switch on the drive for the printed circuit carrier 4 to move it into the next mounting position and to locate it there by means of the indexing device.

The next mounting operation can now begin by moving the tool 9 again from the parking position to the pick-up position.

If no drive is provided for it the printed circuit board carrier 4 is moved manually, the left front cover part 33 being removed for this purpose to make the printed circuit board carrier 4 accessible for handling. At the same time the microscope 37 is preferably used, should it be necessary, to enable the printed circuit board carrier 4 to be placed exactly in the mounting position.

In the present exemplary embodiment the z-direction is described as the vertical direction with the x- and y-directions running normally thereto. The mounting device or the tool can, however, also be arranged spatially so that the z-direction runs at any desired angle to the horizontal. Furthermore the z-direction can also be arranged at an angle to the x-y-directions other than a right angle.

What is claimed is:

1. A mounting device for mounting components on printed circuit boards, comprising a supply means for the components, a first unit in the form of a printed circuit board carrier for holding at least one printed circuit board and a second unit, arranged in a plane above said supply means and above said printed circuit board carrier, in the form of a tool movable in the z-direction to transfer the components from the supply means to the printed circuit board held in the printed circuit board carrier, wherein the two units are movable relative to each other in x-y-planes and the tool is arrestable in a predetermined parking position so as to deposit the component taken from the supply means on the printed circuit board.

2. A mounting device according to claim 1, wherein said printed circuit board carrier can be arrested in mounting positions in which the respective point on the printed circuit board to be mounted is aligned with the tool located in the parking position.

3. A mounting device according to claim 2, wherein the mounting positions of said printed circuit board carrier can be located by means of a programmable indexing device.

4. A mounting device according to claim 2, wherein said printed circuit board carrier can be moved into said mounting positions by means of a drive.

5. A mounting device according to claim 1, which includes at least one pick-up position into which the tool can be moved and in which it can be moved in the z-direction to pick up the component from the supply means.

6. A mounting device according to claim 5, wherein said tool can be arrested in the pick-up position.

7. A mounting device according to claim 5, wherein said tool can be moved into the pick-up position by means of a drive.

8. A mounting device according to claim 5, wherein said tool can be moved automatically in the z-direction on reaching the pick-up position.

9. A mounting device according to claim 1, wherein said supply means can be moved into delivery positions in which the components to be delivered are aligned with the tool located in the pick-up position.

10. A mounting device according to claim 9, wherein said supply means can be arrested in said delivery positions.

11. A mounting device according to claim 9, wherein said delivery positions of said supply means can be located by means of a programmable indexing device.

12. A mounting device according to claim 9, wherein said supply means can be moved into said delivery positions by means of a drive.

13. A mounting device according to claim 1, wherein said supply means is arranged in a plane above said printed circuit board carrier.

14. A mounting device according to claim 13, wherein said supply means projects into the field of movement of said printed circuit board carrier.

15. A mounting device according to claim 1, wherein said supply means is provided with containers to accommodate different components.

16. A mounting device according to claim 1, wherein said supply means includes a conveyor belt or a magazine with an exchangeable turntable.

17. A mounting device according to claim 1, wherein a cover for said supply means and said printed circuit board carrier having respective access openings for the tool to enter said printed circuit board carrier and said supply means is arranged in a plane between the raised and the lowered tool positions.

18. A mounting device according to claim 17, wherein said cover is removable.

19. A mounting device according to claim 17, wherein said cover has a plurality of parts and the two access openings comprise recesses cut out from the edges of at least one cover part.

20. A mounting device according to claim 19, wherein said cover includes at least one stationary cover part and at least one displaceable cover part.

21. A mounting device according to claim 1, which includes a microscope whose field of vision includes the point of the printed circuit board at which a component is to be mounted.

22. A mounting device according to claim 1, wherein said tool-arresting device includes a fixed stop on a frame part of said mounting device and a counter-stop on a tool-supporting arm that carries the tool and is moveable on said frame part.

23. A mounting device according to claim 1, wherein said tool-arresting device includes a pin guided to reciprocate back and forth on said frame part and a bore formed in said supporting arm to accommodate said pin with substantially no play.

24. A mounting device according to claim 23, wherein said bore includes an inner bore section for accommodating said pin with substantially no play, and an outer bore section, conically tapered towards the inner bore section, of which the largest cross-section forms a capture region for catching the pin and for moving the tool-supporting arm until the pin is accommodated in the inner bore section.

25. A mounting device according to claim 24, which includes a further second sensor circuit which includes a sensor fixed to said frame part and a signal generator fixed to said tool-supporting arm which serves to switch on said electric motor to lower said pin or to switch on said electromagnet when said sensor reaches the region of said signal generator, said signal generator region having substantially the same size as the capture region of said outer bore section or said electromagnet.

26. A mounting device according to claim 23, wherein said pin is coupled to the free end of the crank arm of a thrust crank, operable by an electric motor.

27. A mounting device according to claim 26, which includes a sensor circuit to detect the dead center positions of said pin and to switch on said electric motor on reaching these dead center positions.

28. A mounting device according to claim 26, which includes a further third sensor circuit to detect the upward movement of the tool located in the parking position and/or in the pick-up position and to switch on said electric motor to lift said pin and/or to switch on said drive of the supply means on detecting the upward movement.

29. A mounting device according to claim 1, wherein said tool-arresting device includes an electromagnet fixed to the frame part and two counter-poles fixed to the tool-supporting arm, there being a gap provided between the poles of the electromagnet and the counter-poles which together with the strength of the electromagnet defines a capture region for the counter-pole.

* * * * *